United States Patent [19]

Miles

[11] Patent Number: 5,528,455

[45] Date of Patent: Jun. 18, 1996

[54] MODULAR INSTRUMENT CHASSIS

[75] Inventor: Michael D. Miles, Portland, Oreg.

[73] Assignee: Tektronix, Inc., Wilsonville, Oreg.

[21] Appl. No.: 430,013

[22] Filed: Apr. 26, 1995

[51] Int. Cl.⁶ .................................................. H05K 7/20
[52] U.S. Cl. .................................................... 361/695
[58] Field of Search .......................... 361/688, 690–695, 361/724–727, 831; 454/184

[56] References Cited

U.S. PATENT DOCUMENTS 4,672,509  6/1987  Speraw ..................................... 361/695

FOREIGN PATENT DOCUMENTS 1089396  4/1989  Japan ...................................... 361/690
2004000  1/1990  Japan ...................................... 361/695
5299861  11/1993  Japan ..................................... 361/692
6164179  6/1994  Japan ...................................... 361/690

*Primary Examiner*—Gregory D. Thompson
*Attorney, Agent, or Firm*—Bennet K. Langlotz; Boulden G. Griffith

[57] ABSTRACT

A modular instrumentation system with a chassis having a number of module slots and having a plenum providing airflow to the slots. A ventilator connected to the chassis blows air into the plenum. A number of dampers are connected to the chassis, each adjacent a respective module slot and movable between a closed position blocking airflow between the plenum and the module slot, and an open position permitting airflow between the plenum and the module slot. Each damper is biased to the closed position and automatically moves to the open position in response to installation of a module in the module slot.

18 Claims, 4 Drawing Sheets

MODULAR INSTRUMENT CHASSIS

FIELD OF THE INVENTION

This invention relates to modular electronic instrument systems, and more particularly to ventilation systems for cooling such systems.

BACKGROUND AND SUMMARY OF THE INVENTION

Modular instrument systems permit a variety of different electronic instruments to be installed and interconnected in a single chassis. To create a customized system of test, measurement, and analysis equipment, such as for automated testing, a user selects the required modules, and installs them in a chassis that provides power, cooling, and functional electronic interconnection between the modules. Typically, the chassis is in the form of a cabinet with a large front aperture in which modules may be inserted side-by-side in the manner of books on a bookshelf. An example of such a system is a VXI (VME Extension for Instrumentation) test chassis using the VXIbus standard.

Ventilation of all the modules is provided by the chassis. In existing systems, each module has a housing through which air may flow for cooling, with perforated or open top and bottom panels permitting vertical air flow through the module. The chassis includes a fan that blows air from a plenum below all the modules to an exhaust plenum above the modules.

For many applications, a user may not require as many instrument modules as there are available slots in the chassis. However, when one or more slots are empty, much of the cooling air follows the path of least resistance through the empty slots, leaving the installed modules inadequately ventilated. To avoid this impairment of cooling, existing systems provide solid dummy modules that block the flow of air. When dummy modules are installed in all open slots in the chassis, air flow is directed only through the functional modules. However, dummy modules may be inadvertently omitted, particularly as systems are reconfigured for different later uses by different personnel unaware of the importance of the dummy modules. Also, when not in use, the dummy modules require storage space that may not be available nearby the location of the system.

The embodiment disclosed herein overcomes these disadvantages by providing a modular instrumentation system with a chassis having a number of module slots and having a plenum providing airflow to the slots. A ventilator connected to the chassis blows air into the plenum. A number of dampers are connected to the chassis, each adjacent to a respective module slot and movable between a closed position blocking airflow between the plenum and the module slot, and an open position permitting airflow between the plenum and the module slot. Each damper is biased to the closed position and automatically moves to the open position in response to installation of a module in the module slot.

DETAILED DESCRIPTION OF A PREFERRED EMBODIMENT

Figure 1:
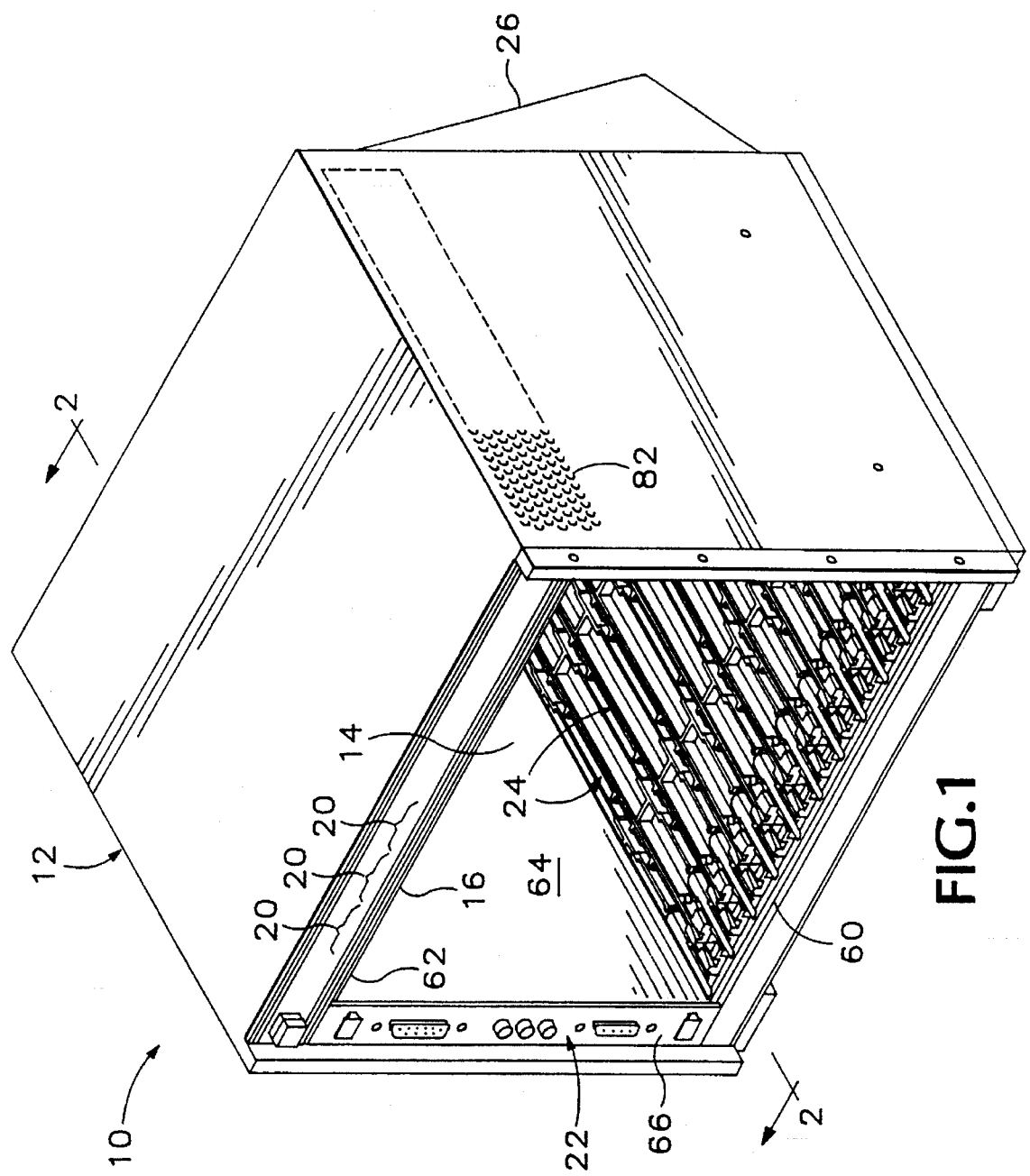
FIG. 1 is an isometric view of an apparatus according to a preferred embodiment of the invention.

FIG. 1 shows a modular instrument system 10. A chassis 12 in the form of a rectangular cabinet or housing defines a chamber 14 that is open at a front aperture 16. The chamber may be considered as divided into thirteen slots 20, although there are no dividers between slots. Each slot 20 is configured to receive a standard instrument module 22, with only a single module shown installed. Some larger modules may occupy two or more slots. A lower module guide 24 forms the lower boundary of each slot, and together with a similar upper guide (not shown), provides a guide to permit a module to be inserted into the chamber while constrained against lateral or rotational movement. The rear of the chassis 10 includes a fan housing 26.

Figure 2:
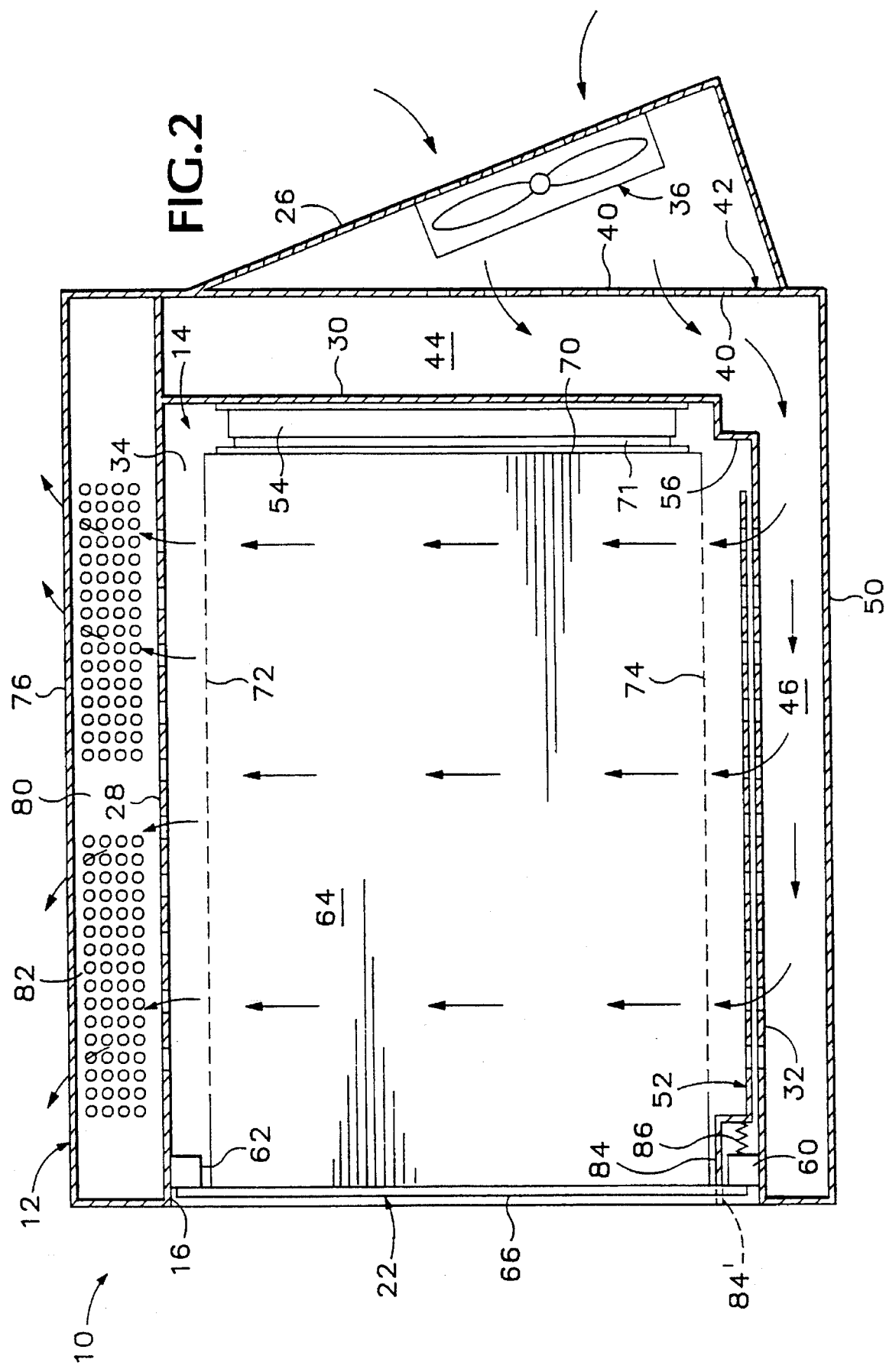
FIG. 2 is a simplified cross sectional side view of the embodiment of FIG. 1 taken along line 2—2.

As shown in FIG. 2, the chamber 14 is defined by a perforated top plate 28 (which may be omitted), a solid vertical rear wall 30, a perforated lower plate 32, and solid side walls 34. The fan housing 26 includes a fan 36 that draws air through openings in the fan housing, and blows air through holes 40 in a rear chassis panel 42. A rear plenum 44 is defined between the rear wall 30 of the chamber and the rear chassis panel 42. The rear plenum, which may contain electronic circuitry and components (not shown), opens at its lower end into a lower plenum 46 defined below the chamber lower plate 32 and above the bottom housing panel 50. A perforated sliding damper 52 (shown here in simplified form) rests atop the lower plate. In FIG. 2, the guide 24 is omitted for clarity.

The rear wall 30 of the chamber 14 provides a mounting surface for a plurality of electrical connectors 54, with at least one connector for each module slot. A rear curb 56 is formed by the lower plate 32 at the rear of the chamber, a lower front curb 60 is mounted to the lower plate at the aperture of the chamber, and an upper front curb 62 is mounted to the upper plate 28, also at the aperture. The front curbs are rigid elongated bars or extrusions that laterally span the entire chamber so that they define the upper and lower limits of each slot 20 at the aperture 16.

The illustrated module 22 has a flat rectangular body 64 that largely fills a single slot. A ranged front plate 66 has an upper edge that rests against the upper curb 62, and a lower edge that rests against the lower curb 60 when the module is fully installed. The nose or rear face 70 of the module includes a protruding electrical connector 71 that mates with connector 54. The module has perforated upper and lower surfaces 72, 74 that permit air to flow vertically through the module body to cool the electronic components therein.

A solid top housing panel 76 is spaced above the top plate 28 of the chamber to define an upper plenum 80. The chassis side wall define an array of exhaust perforations 82 that provide free air flow from the upper plenum to the environment.

When the fan is operating and the damper is open as will be discussed below, ambient air is drawn by the fan 36 into the fan housing 26, and forced into the rear plenum 44 and the lower plenum 46, which are thus pressurized above ambient pressure. The pressurized air flows upward through the perforations of the lower plate 32 and any open dampers 52, through the module's lower surface 74, up through the module body 64, and out of the module's upper surface 72. The air then enters the upper plenum and is exhausted through the exhaust perforations 82.

Each damper 52 functions to provide free air flow to its slot when a module is fully installed as shown, and to block the air flow when no module is present so that the air flow may be diverted for more effective cooling of other slots occupied by modules. The damper includes an actuator bar 84 that extends horizontally toward the front of the chassis at a level above the lower curb 60. When there is no module installed in the slot corresponding to the damper, the free end of the actuator extends beyond the front of the curb, out of the aperture 16 to position 84'. A spring 86 (shown schematically) is connected to the damper to bias it to a closed position when no module is installed. When a module is installed as shown, the module face plate 66 encounters the actuator to move the damper to the open position, and maintain it open as long as the module remains installed.

The damper is perforated with the same pattern as the portion of the perforated panel 32 that underlies it. Thus, when the patterns are registered when the damper is open, the damper does not constrict the airflow. When closed, the solid portions of the damper entirely obscure the perforations of the corresponding portion of panel 32.

Figure 3:
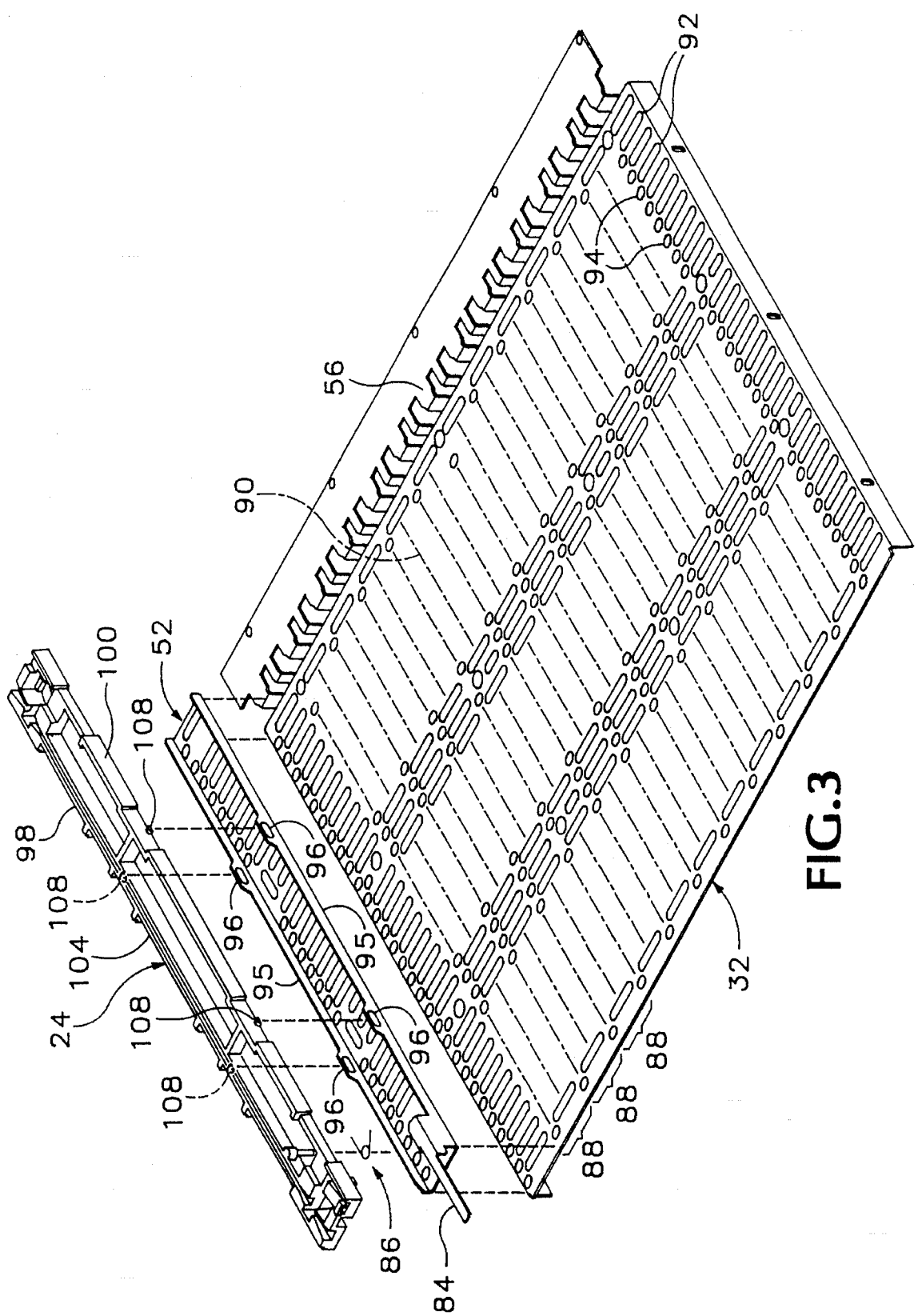
FIG. 3 is an exploded isometric view of the damper assembly of the embodiment of FIG. 1.

As shown in FIG. 3, the plate 32 defines numerous perforation rows 88, with each row corresponding to a single module slot. Each row has the same perforation pattern so that all dampers may have the same design. Each row is aligned parallel to a longitudinal axis 90 that is parallel to the sliding direction of each module and damper. The perforation pattern of each row consists primarily of a series of oblong holes 92 having semicircular ends. The holes 92 are evenly spaced apart parallel to each other and perpendicular to the length of the row.

The width of the holes 92 is no more than half the center-to-center spacing or pitch, so that the material between the holes is at least just wide enough to obscure similar holes in an overlaid closed damper, but so that the holes are as large as possible to minimize air flow restriction through an open damper. In the preferred embodiment, the pitch is 1.0 cm, and the hole width is 0.5 cm. This shall be considered as being 50% perforated, with the hole width at 50% of the pitch. Each row 88 also includes a series of smaller holes 94 having the same width and pitch, but offset longitudinally from the larger holes 92 by half the pitch to provide for a stronger part, and to avoid the possibility that the strips of material separating full width holes in the damper may catch in the slots in the plate 32.

The damper plate 52 has the same hole pattern as a row 88 of plate 32. The damper is formed as a U-shaped channel for rigidity, with upwardly extending flanges 95 defining narrow elongated slots 96, two on each flange.

Figure 4:
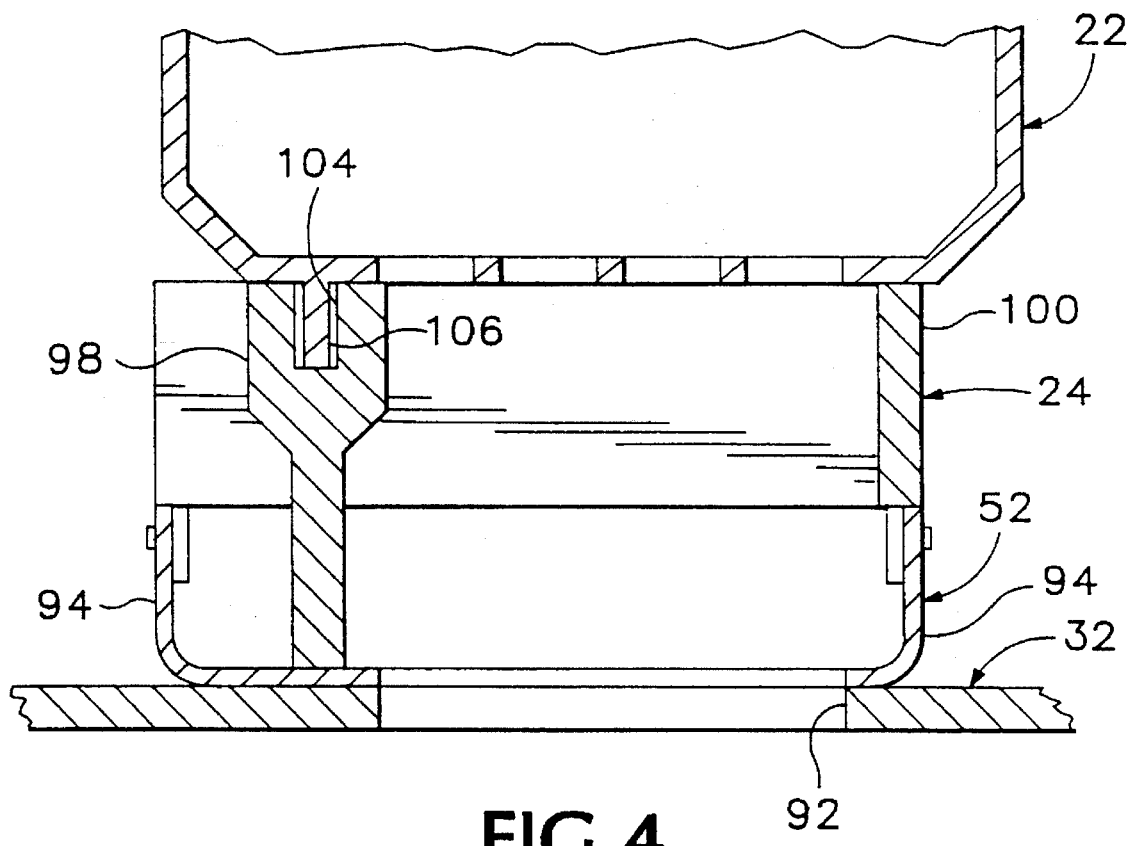
FIG. 4 is a lateral cross sectional side view of the damper assembly of the embodiment of FIG. 1.

The guide 24 is an elongated molded plastic part that has at its rear a latch that connects to the rear curb 56, so that the guide is fixed to the chassis. As also shown in FIG. 4, the guide has opposed vertical elongated side walls 98, 100 that run the length of the part. The side walls extend vertically from the damper to the module above to trap air flowing from below and to direct it upward to the module 22 with minimal lateral leakage to any adjacent unoccupied module slots. The side wall 98 defines in its upper surface a groove 104 that receives a module flange 106 on the bottom of the module. The groove extends the length of the guide to facilitate smooth insertion and removal of the module. The side walls each include horizontal bosses 108 that are received in the slots 96 on the damper flanges to provide constrained sliding of the damper relative to the fixed guide and plate 32. The length of the slots 96 establishes the limits of the open and closed position, so that the damper may slide by a distance of only one half the pitch of the holes 92.

A torsion spring 86 with elongated ends is mounted to a vertical boss near the front end of the guide. One end of the spring contacts the side wall 98, while the other protrudes laterally. The laterally protruding end contacts the upstanding support for the actuator 84, biasing it forward, and resisting its rearward movement until the sufficient force of insertion of a module moves the damper to the open position.

While the disclosure is described in terms of a preferred embodiment, the claims are not intended to be so limited.

I claim:

1. A chassis for containing a plurality of removable instrument modules, the chassis comprising:

a housing defining a plurality of module slots;

a perforated fixed plate connected to the housing;

a ventilator connected within the housing;

a plenum within the housing in communication with the ventilator and adjacent each of the module slots;

a plurality of independently operable dampers, each connected to the housing adjacent a respective module slot and movable between an open position and a closed position and the dampers perforated movable plates overlaying the fixed plate; and a movable actuator connected to each of the dampers and extending into a respective module slot when the damper is on the closed position, such that insertion of a module into the slot contacts the actuator and moves the damper to the open position to provide ventilation to the module.

2. The apparatus of claim 1 wherein the fixed plate defines a plurality of perforations in a first pattern, and at least a portion of the movable plate defines a plurality of perforations in a second pattern substantially the same as the first pattern, such that the second pattern is in registration with the first pattern when the damper is in the open position.

3. The apparatus of claim 1 wherein the fixed plate is less than or equal to 50% perforated.

4. The apparatus of claim 1 wherein the movable plate is less than or equal to 50% perforated.

5. The apparatus of claim 1 wherein each movable plate includes solid portions between the perforations and wherein the solid portions entirely obscure the perforations of the corresponding portion of the fixed plate when the damper is in the closed position, such that air flow is blocked.

6. The apparatus of claim 1 including a plurality of electrical connectors within the housing, each registered with a respective module slot, such that a module inserted in the slot may be electrically connected to the chassis.

7. The apparatus of claim 1 wherein the dampers are spring biased to the closed position.

8. The apparatus of claim 1 wherein each module slot is an elongated chamber extending from a housing aperture into the housing along a slide axis, and wherein the dampers are linearly movable along the slide axis in response to insertion of a module along the slide axis.

9. The apparatus of claim 8 wherein the dampers define an array of spaced apart elongated perforations, each oriented perpendicular to the slide axis.

10. The apparatus of claim 9 wherein the perforations are spaced apart with a pitch of a first distance, and each perforation has a width less than or equal to half the first distance.

11. The apparatus of claim 1 wherein the housing includes a perforated fixed plate defining in part the plenum, and defining an elongated array of perforations for each module slot, and wherein the damper is an elongated perforated movable plate overlaying the elongated array and having spaced apart perforations corresponding to the elongated array.

12. A modular instrumentation system comprising:
   a chassis defining a plurality of module slots and defining a plenum in selectable airflow communication with the module slots;
   a perforated fixed plate connected to the chassis between the plenum and the module slots;
   a ventilator connected to the chassis and in airflow communication with the plenum;
   a plurality of dampers connected to the chassis, each associated with a respective module slot and movable between a closed position blocking airflow between the plenum and the module slot, and an open position permitting airflow between the plenum and the module slot, and the dampers comprising perforated movable plates overlaying the fixed plate; and
   each damper being biased to a closed position and operable to move to the open position in response to installation of a module in the module slot.

13. The apparatus of claim 12 wherein the fixed plate defines a plurality of perforations in a first pattern, and at least a portion of the movable plates define a plurality of perforations in a second pattern substantially the same as the first pattern, such that the second pattern may be registered with the first pattern when the damper is in the open position.

14. The apparatus of claim 12 wherein movable plates include solid portions between the perforations and wherein the solid portions entirely obscure the perforations of the corresponding portion of the fixed plate when a damper is in the closed position, such that air flow is blocked.

15. The apparatus of claim 12 wherein each module slot is an elongated chamber extending from a housing aperture into the housing along a slide axis, and wherein the dampers are linearly movable along the slide axis in response to insertion of a module along the slide axis.

16. The apparatus of claim 15 wherein the dampers define an array of spaced apart elongated perforations, each oriented perpendicular to the slide axis.

17. The apparatus of claim 12 including at least a single module having a contact portion positioned to contact a damper and to move the damper to the open position when the module is installed in one of the module slots.

18. The apparatus of claim 12 wherein the dampers are independently operable.

* * * * *